(12) United States Patent
Motomura (10) Patent No.: US 6,960,372 B2
(45) Date of Patent: Nov. 1, 2005

(54) COATING FILM DRYING METHOD, COATING FILM FORMING METHOD, AND COATING FILM FORMING APPARATUS

(75) Inventor: Shuho Motomura, Kumamoto (JP)

(73) Assignee: Hoya Corporation, Tokyo (JP)

( * ) Notice: Subject to any disclaimer, the term of this patent is extended or adjusted under 35 U.S.C. 154(b) by 155 days.

(21) Appl. No.: 10/260,307

(22) Filed: Oct. 1, 2002

(65) Prior Publication Data

US 2003/0064159 A1 Apr. 3, 2003

(30) Foreign Application Priority Data

Oct. 3, 2001 (JP) ..................................... P.2001-307392

(51) Int. Cl.$^7$ .............................. B05D 3/04; F26B 7/00
(52) U.S. Cl. ....................... 427/358; 427/356; 427/378; 427/384; 427/407.1; 427/434.3; 427/444; 34/302; 34/305; 34/307; 34/309; 34/311; 34/465; 34/487
(58) Field of Search ................................ 427/348, 356, 427/358, 434.3, 372.2, 378, 384, 391, 395, 407.1, 411, 414, 444; 34/302, 305, 307, 309, 311, 465, 487

(56) References Cited

U.S. PATENT DOCUMENTS 6,482,558 B1 * 11/2002 Singh et al. .................. 430/30

FOREIGN PATENT DOCUMENTS

| JP | 2001-62370 | 3/2001 |
| JP | 2001-321711 | * 11/2001 |

* cited by examiner

Primary Examiner—Katherine Bareford
(74) Attorney, Agent, or Firm—Sughrue Mion, PLLC (57) ABSTRACT

The present invention uniformly dries, in a clean room in which down flow is constituted, a coated film formed on a surface of a substrate held in a state that the coated surface faces down. In a coating apparatus including an absorption board holding a substrate in a state that its surface to be coated looks down, and a coating mechanism that coats with coating liquid the surface to be coated of the substrate held by this absorption board, there is provided an air current generating apparatus which supplies clean gas toward the surface to be coated.

16 Claims, 11 Drawing Sheets

COATING FILM DRYING METHOD, COATING FILM FORMING METHOD, AND COATING FILM FORMING APPARATUS

BACKGROUND OF THE INVENTION

1. Field of the Invention

The present invention relates to technology of forming a coating film on a surface of a substrate, and more particularly to technology of drying a coating film formed on a surface to be coated of a substrate held in a state where the surface to be coated faces down in a clean room in which down flow is constituted.

2. Description of the Related Art

Conventionally, as a coating apparatus (coater) which coats on a coating liquid such as photoresist or the like a substrate such as a silicon wafer or the like, a coater in which a coating liquid is dropped in the center of a substrate, and then the substrate is rotated at a high speed thereby to spread the coating liquid on a surface of the substrate by centrifugal force and form a coating film on the substrate surface, which is called spin coater, is mainly used.

On the other hand, recently, technology of forming a coating film with more exact thickness is desired according to more minute patterns and larger size of a photomask used in manufacture of a liquid crystal display. In this view, as a coating apparatus, for example, a CAP coater as disclosed in Japanese Patent Laid-Open No. 2001-62370 is also provided.

In this CAP coater, a nozzle having a capillary gap is sunk in a liquid tank storing a coating liquid therein, the nozzle is raised up to the vicinity of a surface to be coated of a substrate held by an absorption board in a state that the surface to be coated looks downward, the coating liquid is applied from the capillary action gap, and then the nozzle scans over the surface to be coated, whereby a coating film is formed. Herein, since the coating thickness can be surely adjusted by the distance between the surface to be coated and the leading end of the nozzle, the film thickness can be set more exactly than in the spin coater.

Further, since this CAP coater includes a turn mechanism that rotates the absorption board up and down, when the substrate is set, the absorption board is turned until the absorption surface looks up, and the substrate is placed so that the surface to be coated looks up on the absorption surface. Therefore, the CAP coater has such convenience that after the substrate has been thus set, the absorption board is turned until the absorption surface looks down again thereby to perform coating.

On the other hand, though this CAP coater has the above convenience, the absorption board frequently moves slightly even during coating due to backlash in the turn mechanism, which negatively influences the quality of the thin film.

In order to avoid this problem, by fixing the absorption board in a state where the absorption surface looks down, the absorption board is always kept horizontal. Therefore, unsteadiness of the substrate can be surely prevented, so that yield can be improved. Therefore, realization of such the technology is desired.

However, the realization of this technology has the following problems.

Figure 16:
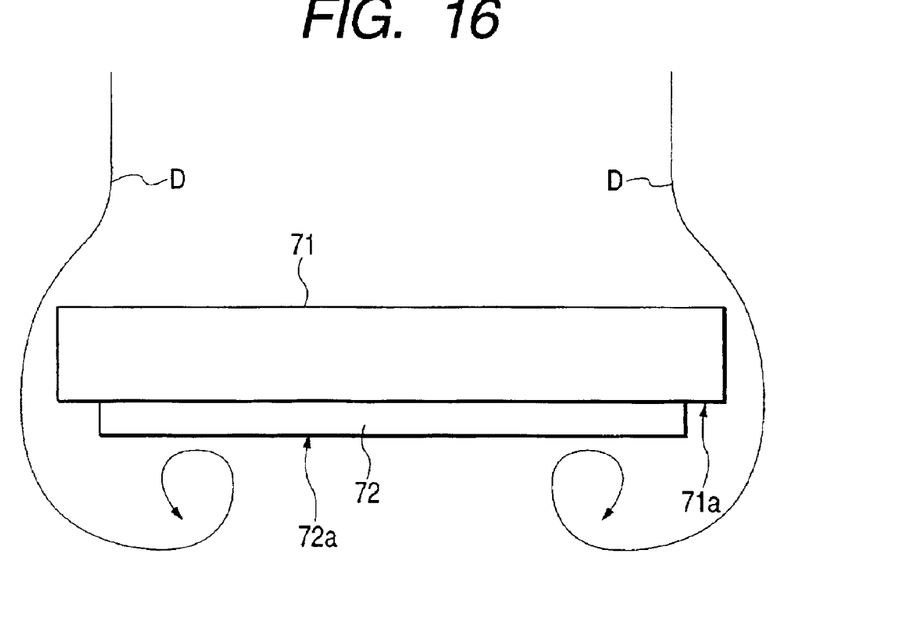
FIG. 16 is a diagram for explaining a problem in the related art.

Namely, in a clean room in which down flow is constituted, as schematically shown in FIG. 16, air flow D of the down flow is shut out on the upper surface of an absorption board 71, the shut-out air flow D turns to an absorption surface 71a side, and air eddy is formed there. In case that the absorption board 71 is fixed in the state where the absorption surface 71a looks down, since a surface to be coated 72a of a substrate 72 always looks down, the coating film is subjected to the air eddy. Accordingly, after coating, when the coating film is dried by down flow, unevenness of the film thickness is produced by the air eddy.

SUMMARY OF THE INVENTION

The invention has been made in an effort to solve the above problems, and its object is to provide technology of drying uniformly the coating film formed on the surface to be coated of the substrate held in the state where the coated looks down in the clean room in which the down flow is constituted.

In order to achieve the above object, a coating film drying method according to the first aspect of the invention is a method by which a coating film formed on the surface to be coated of a substrate held in a state of that the surface to be coated looks down is dried in a clean room in which down flow is constituted. This method is characterized in that after the coating film was formed, while the down flow is being prevented from turning to the side of the surface to be coated in a state of that the posture of the substrate is kept, the coating film is dried.

According to the coating film drying method in the first aspect of the invention, while the down flow is being prevented from turning into the side of the surface to be coated, the coating film is dried. Therefore, in the drying time, the coated film is not subjected to an air eddy caused by the down flow. Accordingly, the coating film can be dried uniformly.

The coating film drying method according to a second aspect of the invention is characterized in that the coating film formed on the surface to be coated is formed by getting a nozzle to scan over the surface to be coated in a state of that a raised coating liquid is brought into contact on the surface to be coated through the nozzle, after raising the coating liquid stored downward of the surface to be coated by capillarity.

According to the coating film drying method in the second aspect of the invention, the thickness of the coating film can be set by the distance between the nozzle and the surface to be coated. Therefore, the coating film having the exact thickness can be formed.

The coating film drying method according to a third aspect of the invention, is characterized in that clean gas is supplied toward the coating film from the downside of the surface to be coated on which the coating film has been formed, whereby it is prevented that the down flow turns to the side of the surface to be coated.

According to the coating film drying method in the third aspect of the invention, when the clean gas supplied toward the coating film from the downside of the surface to be coated on which the coating film has been formed flows against the coated film, it flows along the coating film in the peripheral direction of the surface to be coated. Thereafter, since this flow of the clean gas along the surface to be coated flows against the down flow in the vicinity of the periphery of the surface to be coated, it is prevented that the down flow turns to the side of the surface to be coated. Hereby, since production of the air eddy is prevented, the coating film can be dried uniformly.

The coating film drying method according to a fourth aspect of the invention, is characterized, in the coating film drying method according to the first or second aspect, in that the down flow at the peripheral portion of the surface to be coated on which the coating film has been formed is shut out by a mask, whereby it is prevented that the down flow turns to the side of the surface to be coated.

According to the coating film drying method in the fourth aspect of the invention, since the down flow at the peripheral portion of the surface to be coated on which the coating film has been formed is shut out by the mask, the air eddy is not produced under the surface to be coated. Namely, since the air eddy is produced only on the rear side of the mask, it is prevented that the surface to be coated is exposed to the air eddy. Therefore, the coating film can be dried uniformly.

A coating film drying method according to the fifth aspect of the invention is a method by which a coated film formed by raising by capillarity a coating liquid stored downward of a substrate surface to be coated held in a state of that the surface to be coated looks down in a clean room in which down flow is constituted, and getting a nozzle to scan over the surface to be coated in a state of that the raised coating liquid is brought into contact on the surface to be coated through the nozzle to apply the coating liquid onto the surface to be coated is dried. This method is characterized in that drying means, which dries the coating film locally, scans the surface to be coated so as to follow the nozzle when the nozzle scans over the surface to be coated.

According to the coating film drying method in the fifth aspect of the invention, since the drying means, which dries the coating film locally, scans over the surface to be coated so as to follow the nozzle when the nozzle scans over the surface to be coated, the coating liquid flowing out from the nozzle by the capillary action is immediately dried forcedly by the drying means. Therefore, even if the surface to be coated is subjected to the air eddy produced by the down flow, since the coating film has been already dried, the coated film, upon reception of the influence of the air eddy, does not cause unevenness in dry.

The coating film drying method according to a sixth aspect of the invention, is characterized, in the coating film drying method according to the fifth aspect, in that the drying means is a hot plate.

The coating film drying method according to a seventh aspect of the invention, is characterized, in the coating film drying method according to any of the first to sixth aspects, in that the coating film is a resist film.

The coating film drying method according to an eighth aspect of the invention, is characterized, in the coating film drying method according to any of the first to seventh aspects, in that the substrate is a photomask blank obtained by forming a light shielding film on one surface of a transparent substrate.

A coating film forming method according to the ninth aspect of the invention is characterized in that after the coating film wad dried by the coating film drying method according to any of the first to eighth aspects, holding of the substrate is released, and then the substrate is brought into contact with a conductive member.

According to the coating film forming method in the ninth aspect of the invention, when the substrate is brought into contact with the conductive member, the electric charge applied on the substrate flows to the conductive member leniently. Therefore, it is prevented that the coating film is damaged by electrostatic breakdown, and yield can be improved.

A photomask manufacturing method according to the tenth aspect of the invention includes a step of forming a resist film as the coating film on the light shielding film of the photomask blank by using the coating film drying method according to the eighth aspect.

A coating apparatus according to the eleventh aspect of the invention, which is arranged in a clean room in which down flow is constituted, and includes holding means that holds a substrate in a state of that its surface to be coated looks down, and coating means that coats the surface to be coated of the substrate held by the holding means with a coating liquid, comprises inhibiting means that inhibit the down flow from turning into the side of the surface to be coated with the coating liquid coated by the coating means.

According to the coating apparatus in the eleventh aspect of the invention, since the inhibiting means inhibits the down flow from turning to the side of the surface to be coated, when the coating film is dried in a state of that the substrate is held by the holding means, the coating film is not exposed to the air eddy caused by the down flow.

A coating apparatus according to the twelfth aspect of the invention, which is arranged in a clean room in which down flow is constituted, and includes holding means that holds a substrate in a state of that its surface to be coated looks down, a liquid tank arranged downward of the surface to be coated of the substrate held by the holding means, a nozzle that raises the coating liquid stored in the liquid tank up to the surface to be coated by capillary action and brings the coating liquid into contact with the surface to be coated, and scanning means that gets the nozzle to scan over the surface to be coated thereby to coat the surface to be coated with the coating liquid, is characterized in that: there is provided drying means for drying the coating film locally, and this drying unit scans on the downside of the surface to be coated so as to follow the nozzle scanning over the surface to be coated.

According to the coating apparatus in the twelfth aspect of the invention, when the nozzle scans, the drying means that dries locally the coating film scans so as to follow the nozzle. Therefore, the coating liquid flowing out form the nozzle by capillary action is immediately dried by the drying means forcedly. Therefore, when the coating film is dried in a state of that the substrate is held by the holding means, even if the surface to be coated is subjected to the air eddy generated due to the down flow, since the coating film has been already dried, the surface to be coated, upon reception of the influence of the air eddy, does not cause unevenness in dry.

In the figures, the reference numeral 10 refers to a coating apparatus; 12 to a support block (conductive member); 14 to a moving frame; 16 to a screw rod; 17 to a motor; 19 to an absorption board; 20 to a photo mask blank; 21 to an current generating apparatus; 22 to a coating mechanism; 47 to a nozzle; 64 to a mask; and 65 to a hot plate (drying means).

DETAILED DESCRIPTION OF THE PREFERRED EMBODIMENTS

A coating apparatus to which the invention is applied will be described below with reference to FIGS. 1 to 15. This coating apparatus is used in a photomask manufacturing process, placed in a clean room in which a down flow system is adopted, and used in order to coat a surface to be coated (main surface) of a photomask blank with resist.

(First Embodiment)

Figure 1:
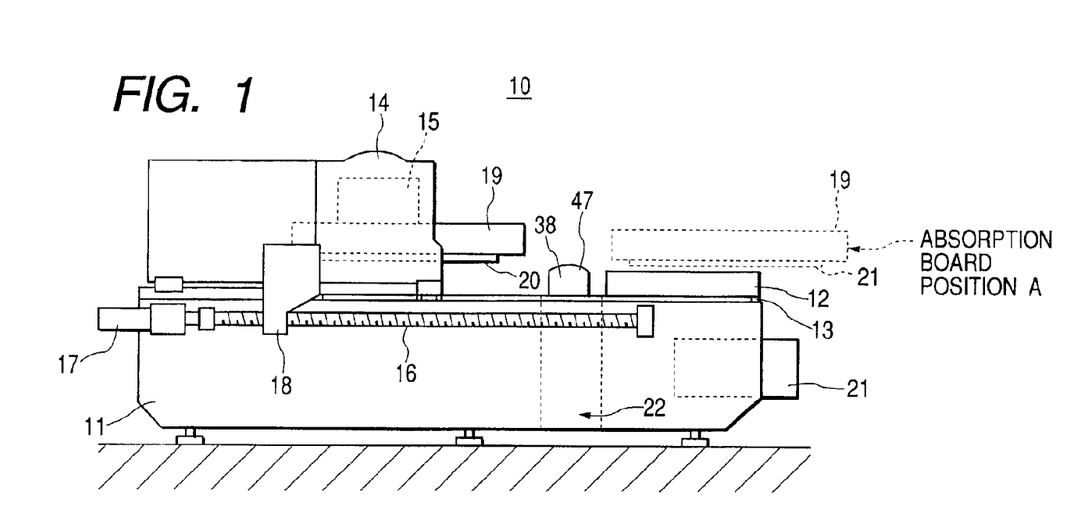
FIG. 1 is a left side view of a coating apparatus according to a first embodiment.
Figure 2:
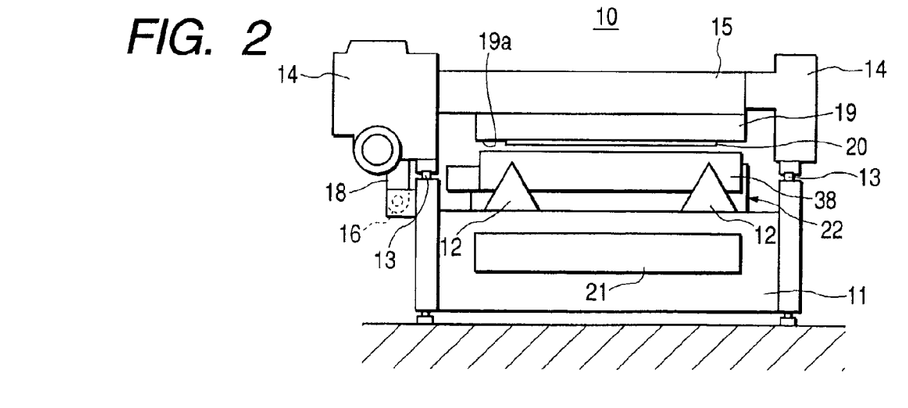
FIG. 2 is a front view of the coating apparatus according to the first embodiment.

FIG. 1 is a left side view of a coating apparatus, and FIG. 2 is a front view of the coating apparatus.

As shown in FIGS. 1 and 2, this coating apparatus 10 includes a base frame 11 set on a horizontal floor surface as a basis. On this base frame 11, a pair of right and left support blocks 12, 12, and a pair of right and left moving frames 14, 14 that can move on linear ways 13, 13 in the back and forth direction (in the left and right direction in FIG. 1) are placed.

Both of the support blocks 12, 12 are made of resin that is high in conductivity thereby to be used as a conductive member. As shown in FIG. 2, the support block 12, 12 has an approximately triangular section, and extends in an appropriate position on the base frame 11 in the back and forth direction (in the left and right direction in FIG. 1). Specifically, these support blocks are arranged in parallel to each other at a distance that is narrower a little than the width of a photomask blank 20 described later.

A pair of the left and right moving frames 14, 14 are connected to each other integrally by a beam 15. These moving frames 14, 14 move along the linear ways 13, 13 by rotating a screw rod 16 provided on the left side surface of the base frame 11 by a motor 17. Namely, for the left moving frame 14, a moving member 18 having an internal thread portion fitting to the screw rod is provided, and this moving member 18 moves with rotation of the screw rod 16 thereby to move the moving frames 14, 14 in the back and forth direction. These moving frames 14, 14, the screw rod 16, and the motor 17 constitute scanning means.

In the center of the beam 15 supported by the moving frames 14, 14 at its both ends, an absorption board 19 as holding means is attached. This absorption board 19 is fixed so as not to rotate in a state of that its absorption surface 19a looks down. On this absorption board 19, the photomask blank 20 that is a substrate is absorbed and held. Further, the absorption board 19, in the state where it holds the photomask blank 20, moves integrally with the movement of the moving frames 14, 14 in the back and forth direction.

Here, the photomask blank 20 is obtained by forming a light shielding film made of chrome (Cr) or the like on one side of a translucent substrate obtained by precisely grinding vitreous silica, and it is an original plate that becomes a base of a photomask used when a fine pattern is transferred onto a semiconductive wafer.

Figure 3:
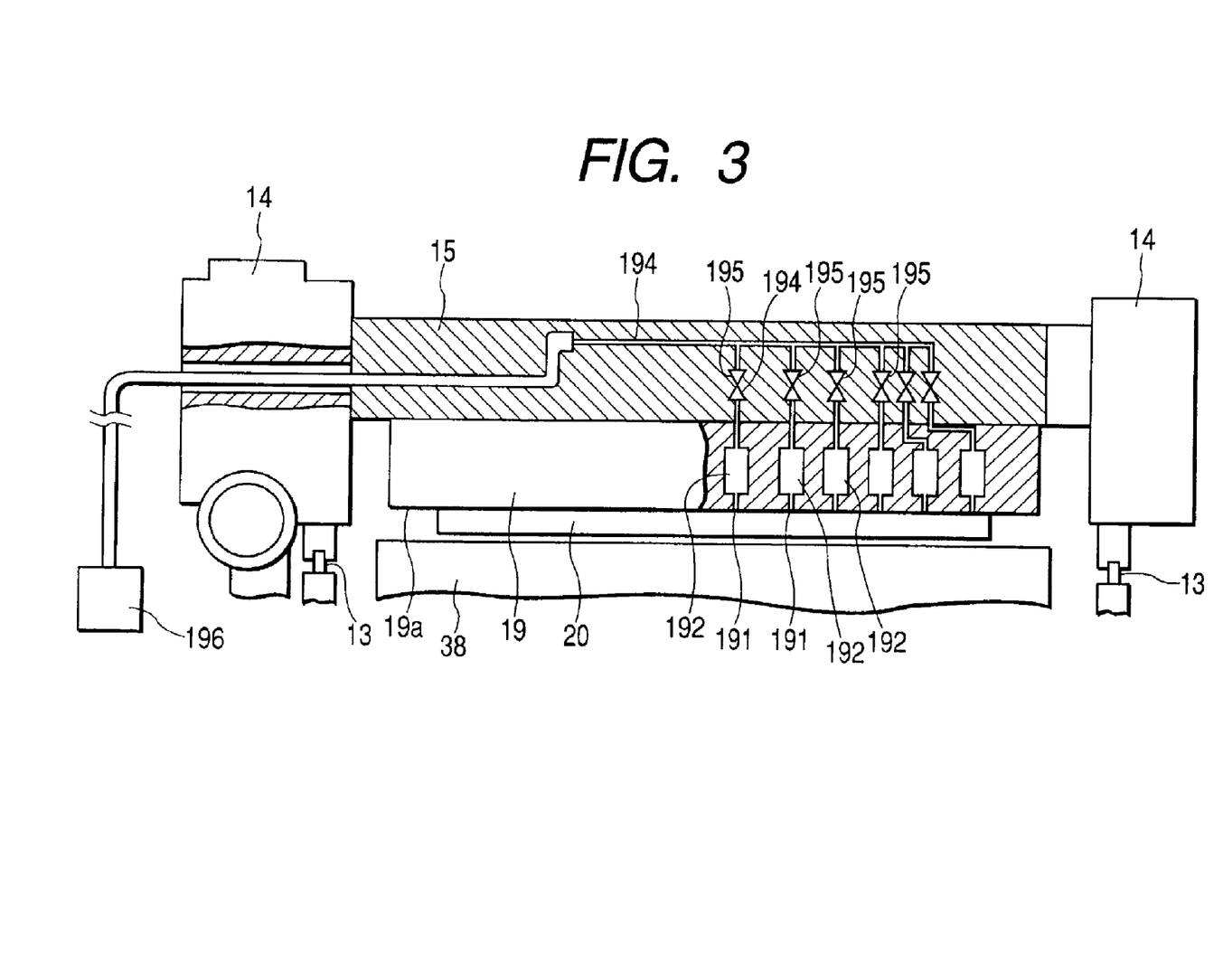
FIG. 3 is a sectional view for explaining the structure of an absorption board.
Figure 4:
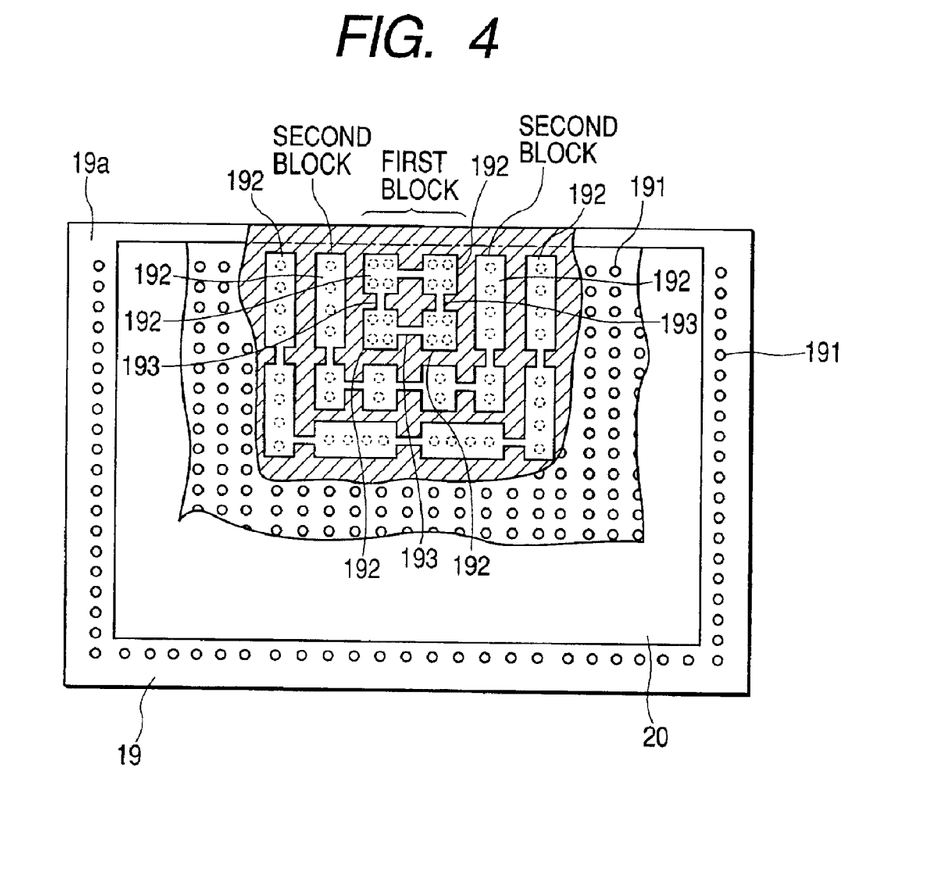
FIG. 4 is a diagram showing an absorption surface of the absorption board.

Next, the absorption structure of the absorption board 10 will be described. FIG. 3 shows a sectional view around the absorption board 19. FIG. 4 shows a rear surface of the absorption board 19, that is, the absorption surface 19a. As shown in FIG. 3, on the absorption surface 19a, plural absorption holes 191, 191 . . . are formed, and these plural absorption holes 191 are arranged regularly and uniformly over the whole surface of the absorption board 19. Further, inside the absorption board 19, absorption space 192 divided into plural blocks is provided.

Specifically, as shown in FIG. 4, a first block comprises four absorption spaces 192 . . . arranged in the center on this side of the absorption surface 19a. These absorption spaces 192 are communicated with each other by thin air passage 193. Further, in each of these four absorption spaces 192, four absorption holes 191 are formed respectively.

With the absorption spaces 192 forming this first block, as shown in FIG. 3, a suction pipe 194 for sucking air communicates, and this suction pipe 194 is inserted into the beam 15 through a manual valve 195. This inserted suction pipe 194 is taken out of the left side of the left moving frame 14 and coupled to a vacuum pump 196.

Further, a second block of the absorption board 19, as shown in FIG. 4, is arranged so as to surround the first block in the shape of C, and comprises six absorption spaces 192 . . . . These absorption spaces 192 . . . also communicate with each other by the air passages 193, and communicate with the vacuum pump 196 by the suction pipe 194. Similarly, a third block, a fourth block . . . are constituted.

Referring again to FIG. 1, inside the base frame 11, there are provided an air current generating apparatus 21 as inhibiting means, and a coating mechanism 22 as coating means.

The air current generating apparatus 21 supplies clean gas in the direction opposed to the down flow in the clean room, that is, in the upward direction. Specifically, the air current generating apparatus 21 includes a fan for generating air current going upward, and an air filter provided above this fan. Here, as an air filter, it is preferable to use an HEPA filter (High Efficiency Particulate Air Filter).

As this air current generating apparatus 21, for example, an SS-MAC-10FR by Air Tech. can be adopted.

Figure 5:
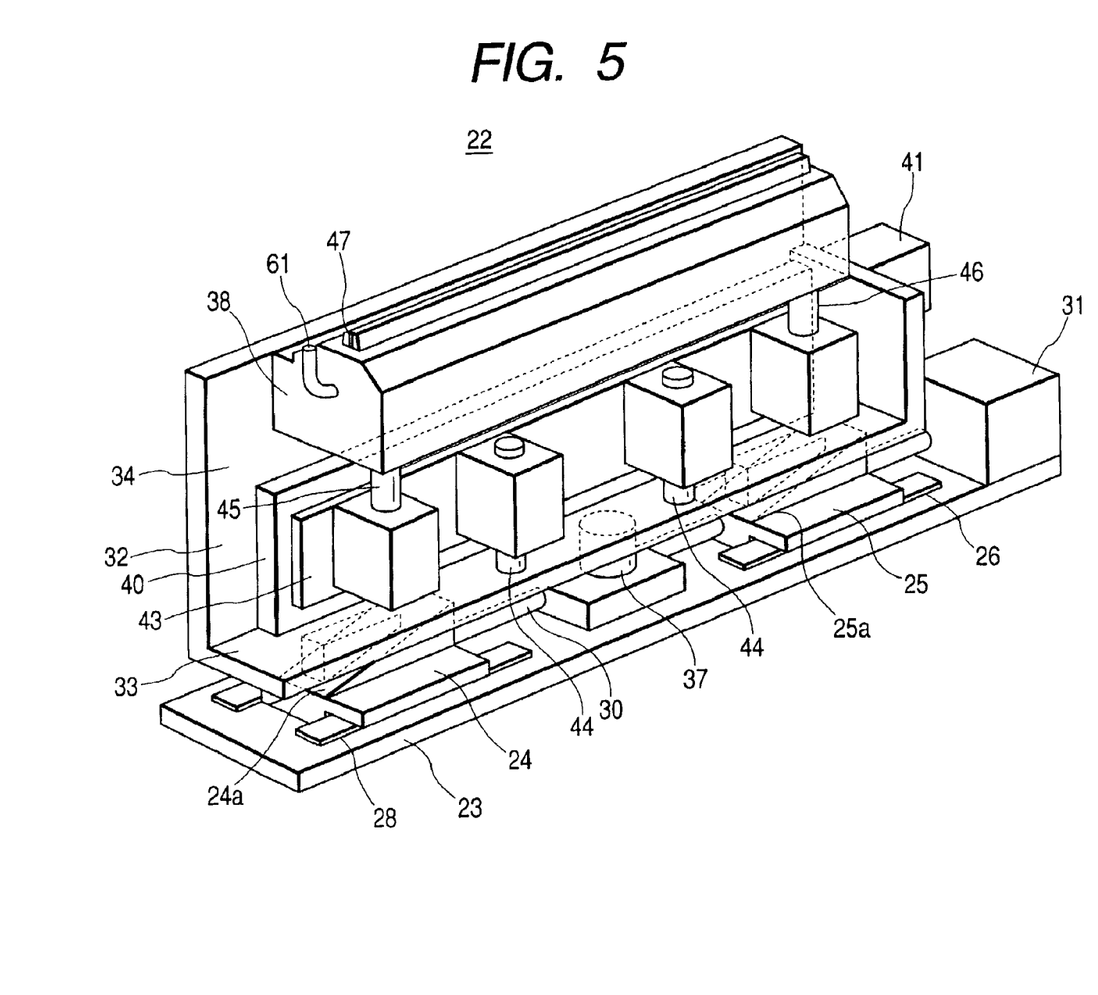
FIG. 5 is a perspective view showing a main portion of a coating mechanism.

Next, the coating mechanism 22 will be described. FIG. 5 is a perspective view of the coating mechanism 22, FIG. 6 is a front view of the coating mechanism 22, and FIG. 7 is a sectional view taken along a line of X—X in FIG. 6.

Figure 6:
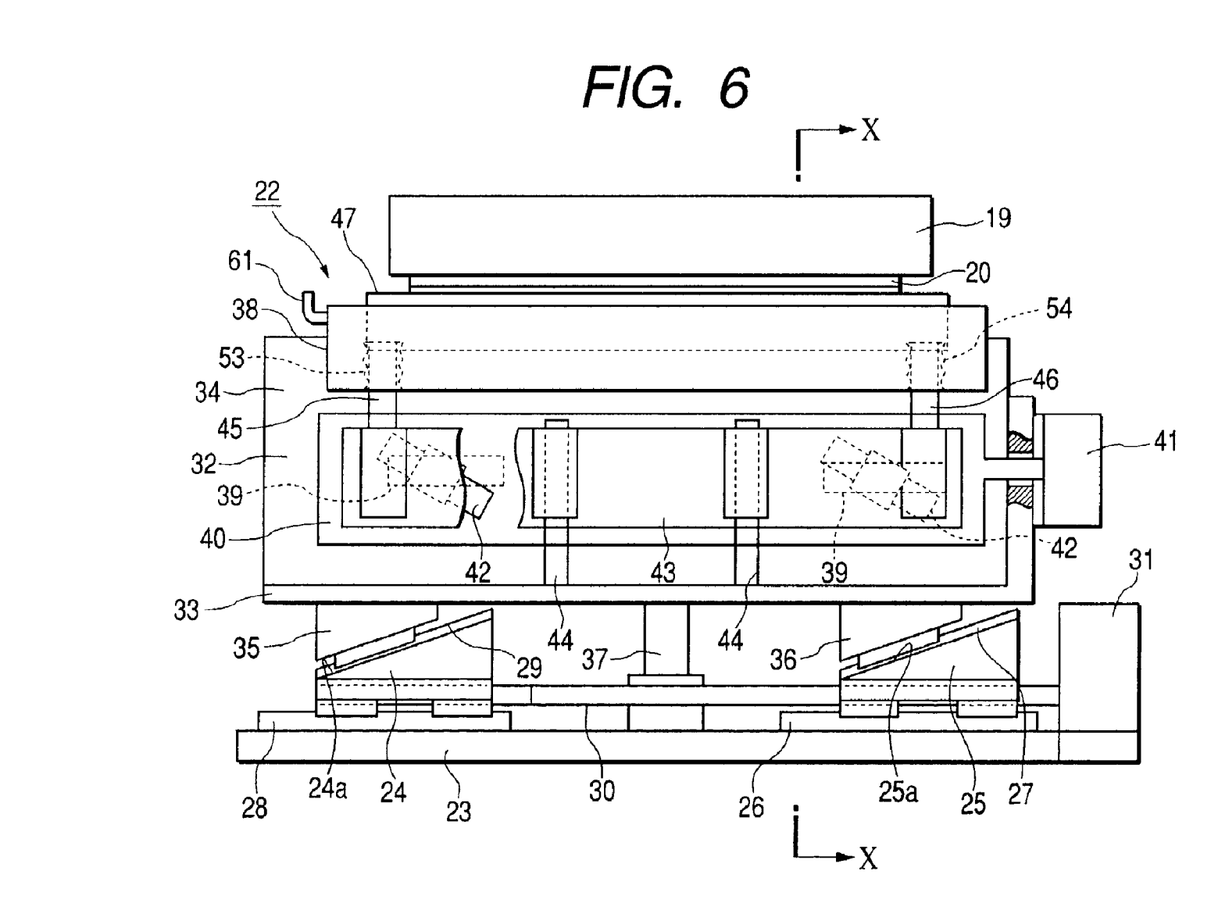
FIG. 6 is a front view showing the main portion of the coating mechanism.
Figure 7:
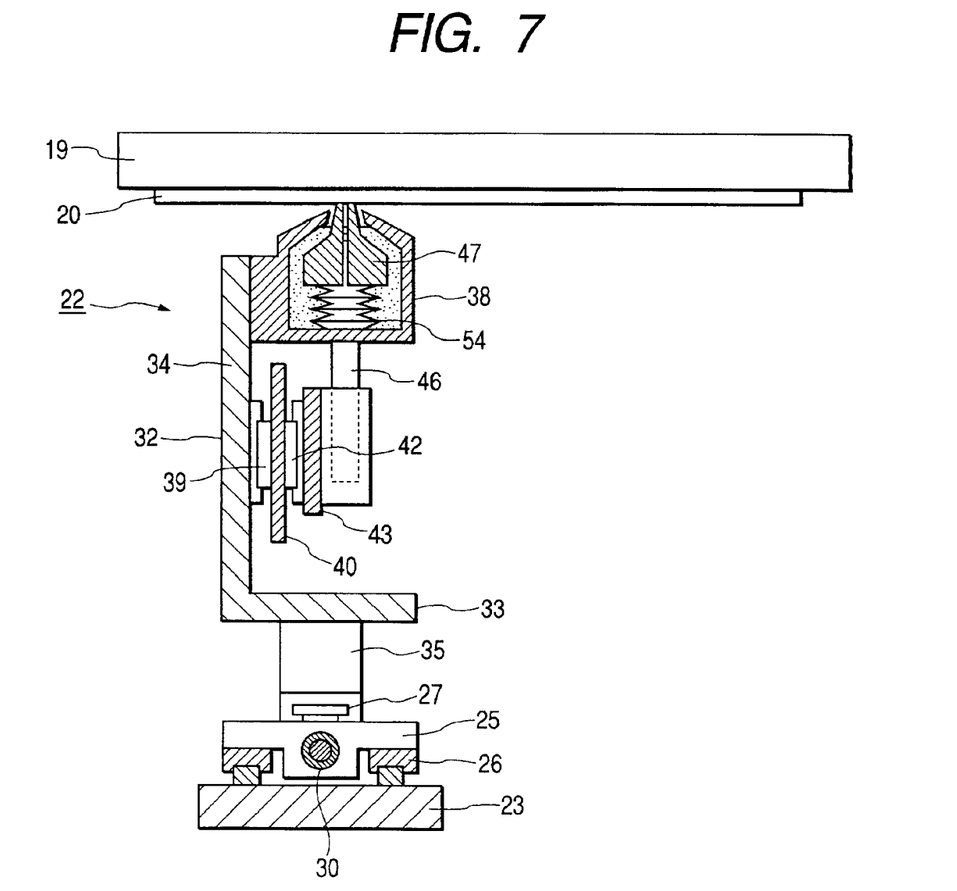
FIG. 7 is a sectional view taken along a line of X—X in FIG. 6.

As shown in FIGS. 5 to 7, the coating mechanism 22 includes as a basis a base plate 23 provided in the left and right direction of the base frame 11. On the base plate 12, a pair of left and right moving cotters 24 and 25 are provided.

The right moving cotter 25 can move along a linear way 26 provided on the upper surface of the base plate 23 in the right and left direction. Further, the upper surface of the moving cotter 25 is a slant surface 25a that inclines leftward. Also, on this slant surface 25a, a linear way 27 is provided.

The left moving cotter 24 can similarly move along a linear way 28 in the left and right direction of a base plate 23. Further, on a slant surface 24a, a linear way 29 is provided.

These moving cotters 24 and 25 are pierced by a coupling shaft 30. On the peripheral surface of the coupling shaft 30, external threading grooves are formed, and in the pierced portions of the moving cotters 24 and 25, internal threading grooves are formed. These external threading grooves and internal threading grooves are fitted to each other. Therefore, the coupling shaft 30 is rotated by a servomotor 31, whereby the moving cotters 24 and 25 go respectively along the linear ways 28 and 26 in the left and right direction.

Above the moving cotters 24 and 25, a support plate 32 is provided. This support plate has L-shaped section, and comprises a first support plate 33 provided in parallel to the base plate 23 and a second support plate 34 provided perpendicularly to this first support plate 33.

On a rear surface of the first support plate 33, a pair of left and right support legs 35 and 36 are provided. The lower surfaces of the support legs 35 and 36 are slant surfaces, and they can slide respectively along the linear way 29 or 27.

Further, a guide shaft 37 for up and down movement is provided, which extends from the center portion of the rear surface of the first support plate 33 to the upper surface of the base plate 23. The support plate 32 can move along this guide shaft 37 only up and down.

To the upper end portion of the second support plate 34, as shown in FIG. 7, a liquid tank 38 storing therein a resist as a coating liquid is fixed. This liquid tank 38 will be described later.

Further, to the second support plate 34, a left/right moving plate 40 is coupled through a pair of left and right linear ways 39, 39 respectively extending in the left and right direction. The left/right moving plate 40 is connected to an air cylinder 41, and moves with drive of this air cylinder 41 along the linear ways 39, 39 only in the left and right direction.

To the left/right moving plate 40, an up/down moving plate 43 is coupled through a pair of left and right linear ways 42, 42 respectively inclining rightward. This up/down moving plate 43 does not move in the left and right direction but can move only up and down along a pair of left and right guide shafts 44, 44 uprightly provided on the upper surface of the first support plate 33.

From the left end portion and the right end portion of the up/down moving plate 43, nozzle support shafts 45,46 extend upward respectively. By a pair of these right and left nozzle support shafts 45, 46, a nozzle 47 is supported.

Figure 8:
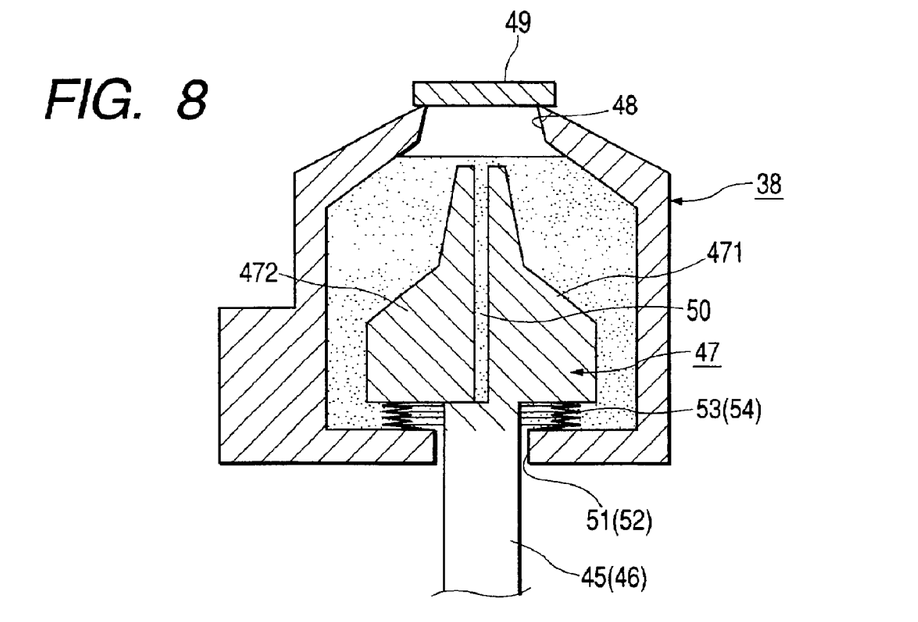
FIG. 8 is a schematic sectional view of a liquid tank.
Figure 9:
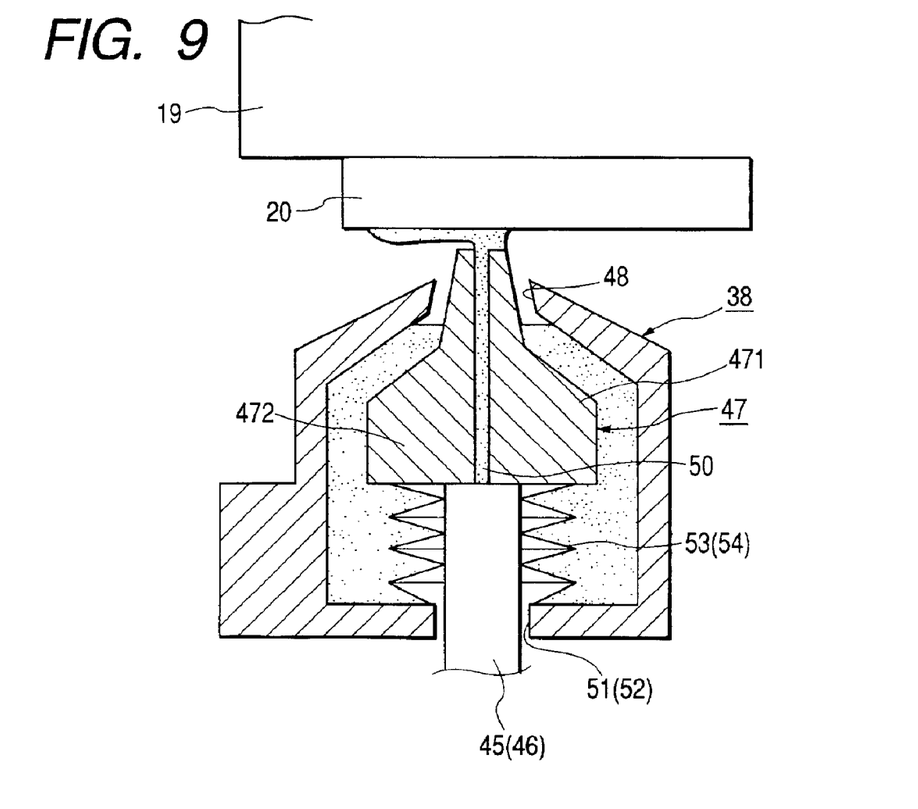
FIG. 9 is a schematic sectional view of the liquid tank.
Figure 10:
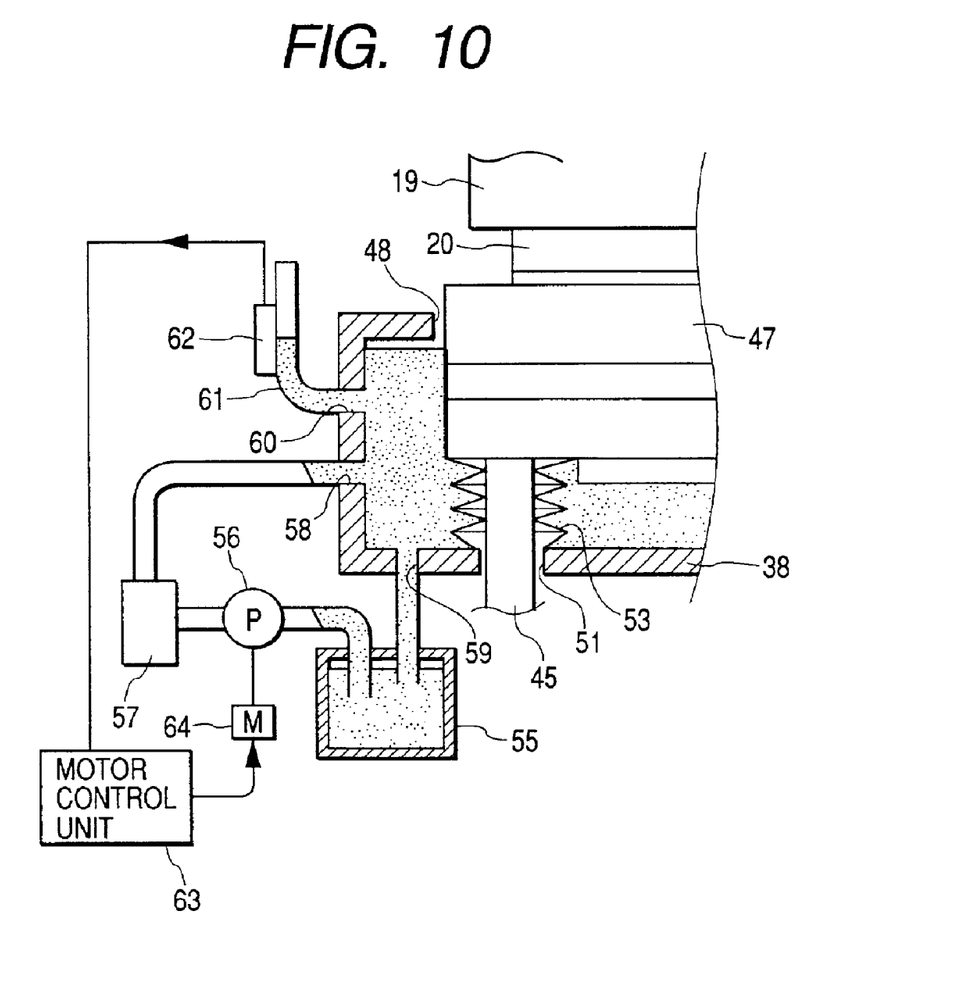
FIG. 10 is a schematic view for explaining a cycle mode of a resist.

Next, the structure around the liquid tank 38 will be described. FIGS. 8 and 9 show sectional views of the liquid tank 38, and FIG. 10 shows schematically a cyclic mode.

The liquid tank 38 extending in the left and right direction at the upper end portion of the second support plate 34, as shown in FIGS. 8 and 9, has an approximately trapezoid section. At its upper end portion, a slit 48 extending in the left and right direction is formed. This slit 48 can be closed by a lid 49 provided on the outside of the liquid tank 38.

In the liquid tank 38, the nozzle 47 is included. This nozzle 47 comprises a pair of front and back nozzle members 471 and 472, which are opposed to each other with a capillary action tube-like gap 50 extending in the left and right direction between. The shapes of these front and back nozzle members 471 and 472 are symmetrical in the back and forth direction, and the members 471 and 472 have a section in which the upper portion is pointed like a bill.

To the left end portion and right end portion of the nozzle 47, a pair of the left and right nozzle support shafts 45,46 are fixed. These nozzle support shafts 45,46 pass through a pair of left and right through-holes 51,52 formed on the bottom surface of the liquid tank 38. In order to prevent the resist (coating liquid) from leaking out of these through-holes 51,52, bellows-like blocking members 53,54 surrounding each nozzle support shaft 45,46 are provided at a region from the bottom surface of the nozzle 47 to the bottom surface of the liquid tank 38. Hereby, even if the nozzle support shaft 45,46 moves up and down, the bellows-like blocking member 53,54 expands and contracts up and down correspondingly. Therefore, the resist does not leak out of the through-hole 51,52.

Further, as shown in FIG. 10, the resist is pumped out from a tank 55 storing the resist therein by a pump 56, and the pumped-out resist flows out through a filter 57 from a supply port 58 formed in a side surface of the liquid tank 38. Further, a cyclic port 59 is opened on the bottom surface of the liquid tank 38, and the resist cycles in the tank 55 from this cyclic port 59.

Further, in the upper portion of a side surface of the liquid tank 38, a through-hole 60 is formed. From the through-hole 60, a L-shaped height-regulating pipe 61 protrudes. The upper end of this height-regulating pipe 61 is opened. Further, on the outer side surface of the height-regulating pipe 61, a sensor 62 for detecting a liquid height of resist is provided.

Namely, in case that the liquid tank 38 has been filled with the resist, the height-regulating pipe 61 is filled with the resist with the same height as the liquid tank 38, the liquid height at that time is detected by the sensor 62, and the detection result is sent to a motor control unit 63 composed of a microcomputer. The motor control unit 63 drives a motor of the pump 56 according to the detection result of the sensor 62, and supplies the coating liquid to the liquid tank 38 till the detection result comes to the previously set height.

Further, this coating apparatus 10 further comprises an input unit and a control unit that controls in whole the operations of the motor 17, the air current generating apparatus 21, the vacuum pump 206, the servomotor 31, and the air cylinder 41 on the basis of input signals from this input unit, though they are not shown.

The operation of the coating apparatus 10 will be described below.

It is assumed that the liquid tank 38 is filled with the resist up to the predetermined height and the nozzle 47 sinks completely under the resist.

Firstly, the not-shown control unit, on the operation by an operator, drives the motor 17, whereby it positions the absorption board 19 in a base position A in FIG. 1, and drives the vacuum pump 206. Here, the operator, in the state the surface to be coated looks down, causes the photomask blank 20 to be absorbed on the absorption surface 19a. Hereby, the photomask blank 20 is held on the absorption board 19.

The surface to be coated means one of surfaces of the substrate, on which the coating liquid is to be applied. Specifically, the surface to be coated of the photomask blank 20 means one of surfaces of the photomask blank 20, on which the resist is to be applied, that is, a surface on which the chrome film has been formed.

Next, the control unit drives the motor 20 again thereby to move the absorption board 19 in the back and front direction so that the leading end of the nozzle 47 comes to a coating start position of the surface to be coated.

Next, the control unit opens the lid 49 closing the slit 48 and drives the servomotor 31 thereby to moves a pair of the right and left moving cotters 24, 25 in the direction where the slant surfaces 24a, 25a incline (left direction in FIG. 6). Correspondingly, the support plate 32 of which the movement is regulated in the left and right direction moves upward along the linear ways 29, 27. Hereby, the liquid tank 38 fixed to the support plate 32 rises up to the downside of the photomask blank 20.

Next, the control unit stops the rise of the liquid tank 38 once and projects only the nozzle 47 from the is liquid tank 38.

Specifically, the control unit drives the air cylinder 41 thereby to move the left/right moving plate 40 in the slant direction of the linear way 42 (in the right direction in FIG. 6). Then, since the movement of the up/down moving plate 43 is regulated in the left and right direction, the plate 43 rises while it is being guided by the slant surface of the linear way 42. Correspondingly, the nozzle support shafts 45,46 fixed to the up/down moving plate 43 rise, so that the nozzle 47 supported by these shafts rises.

Here, since the nozzle has sunk under the resist completely, the capillary action-tube shaped gap 50 is filled with the resist. Namely, the nozzle 47 rises in the state where it is filled with the resist up to the leading end of the capillary action-tube gap 50.

Next, the control unit stops the rise of only the nozzle 47 and raises the liquid tank 38 again thereby to bring the resist into contact with the surface to be coated of the photomask blank 20. Namely, the control unit brings the resist with which the capillary action tube-shaped gap 50 is filled into contact with the surface to be coated.

Here, regarding a rising speed and a rising distance of the liquid tank 38, fairly subtle adjustment is required. However, when the servomotor 31 is driven as described before, the support plate 32 moves up and down along the slant surfaces 24a, 25a of the moving cotters 24, 25. Therefore, this subtle adjustment can be performed surely and readily. Further, since the liquid tank 38 is raised in the horizontal state in the right and left direction, the thickness of the resist film does not-vary in the left and right direction.

Next, the control unit, in the state where it brings the resist into contact with the surface to be coated of the photomask blank 20, causes the liquid tank 38 to descend together with the nozzle 47 up to the position of the coating height. Namely, the distance between the leading end of the nozzle 47 and the surface to be coated comes to the coating thickness.

Next, the control unit moves the motor 17 thereby to moves the absorption board 19 at a constant speed. Hereby, the surface to be coated is coated with the resist.

At this time, since the absorption board 19 is fixed to the beam 15, unsteadiness such as backlash does not occur but either of the posture of the photomask blank 20 in the back and forth direction and that in the left and right direction is always kept horizontal.

Then, the control unit, when the absorption board 19 reaches a coating end position, stops the drive of the motor 17. Here, the coating end position means a position of the absorption board 19 when the resist coating is completed. Specifically, it is preferable that the vicinity of the air current generating apparatus 21 is set as the coating end position. Thus, in case that the coating end position is thus set as the right upside of the air current generating apparatus 21, after coating ends, the next step can immediately proceed to dry of the resist film.

Next, the control unit drives the air current generating apparatus 21. Hereby, the resist film can be dried uniformly.

Figure 11:
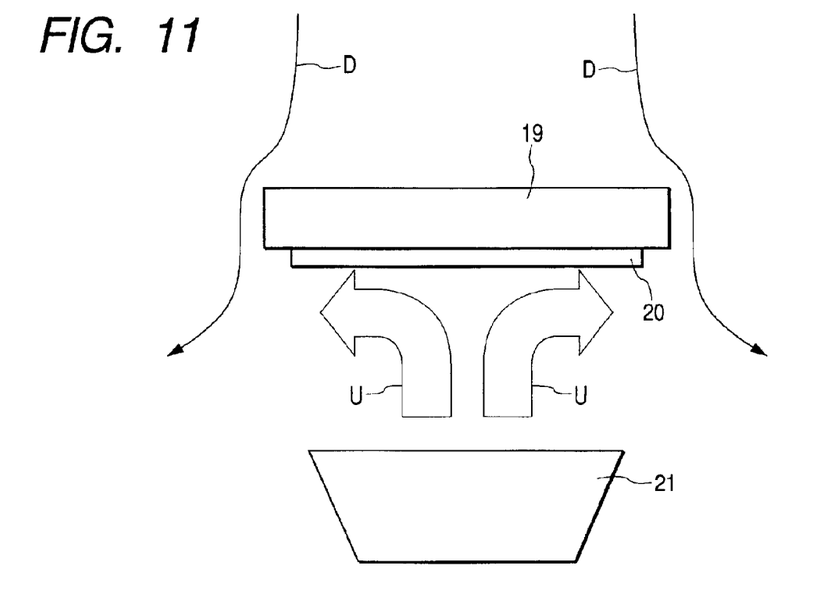
FIG. 11 is a schematic view for explaining air flow around a photomask blank in the drying time.

Its principle will be described with reference to FIG. 11. In FIG. 11, an arrow D represents flow of down flow, and an arrow U represents flow of clean gas supplied by the air current generating apparatus 21. As shown in FIG. 11, when the clean gas supplied upward from the downside of the photomask blank 20 to the resist film by the air current generating apparatus 21 flows against the surface to be coated, it flows along the surface to be coated in its peripheral direction. Accordingly, since the flow of the clean gas along this surface to be coated and the down flow run against each other at the peripheral portion of the photomask blank 20, it is prevented that the down flow turns into the resist film. Hereby, since generation of air eddy is prevented, the resist film can be dried uniformly.

Figure 12:
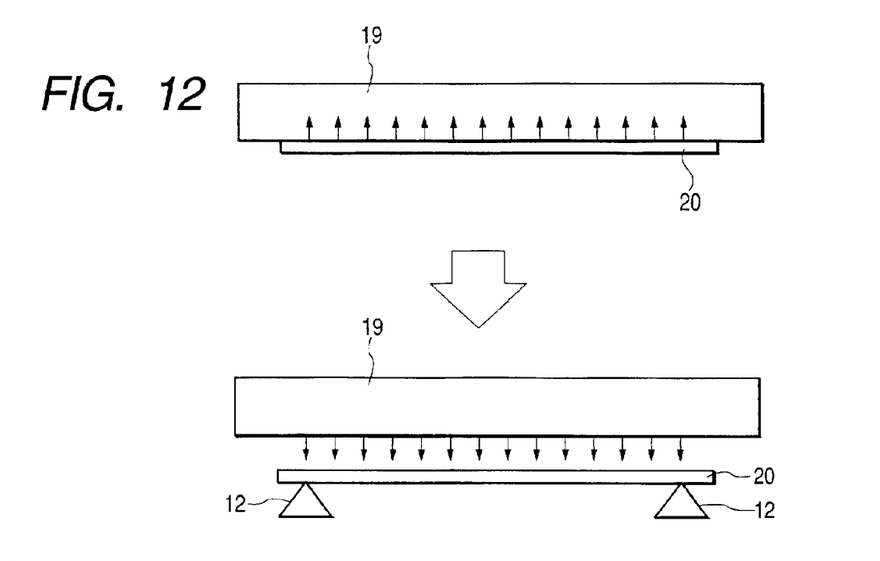
FIG. 12 is a schematic view for explaining a step of separating the photomask blank from the absorption board.

Next, the control unit, when the predetermined time has passed since it drove the air current generating apparatus 21, stops the drive of the air current generating apparatus 21, switches a valve (not shown) in the vacuum pump 206, and discharges air blow from the absorption holes 201. Hereby, as shown in FIG. 12, the photomask blank 20 is separated from the absorption board 19 and placed on a pair of the left and right support blocks 12, 12. Thus, a series of coating operations ends.

Here, since the support block 12 is made of the resin that is high in conductivity, when the photomask blank 20 comes into contact with the support blocks 12, 12, the electric charge applied on the photomask blank 20 flows to the support blocks 12, 12 leniently. Hereby, electrostatic breakdown is prevented.

Figure 13A:
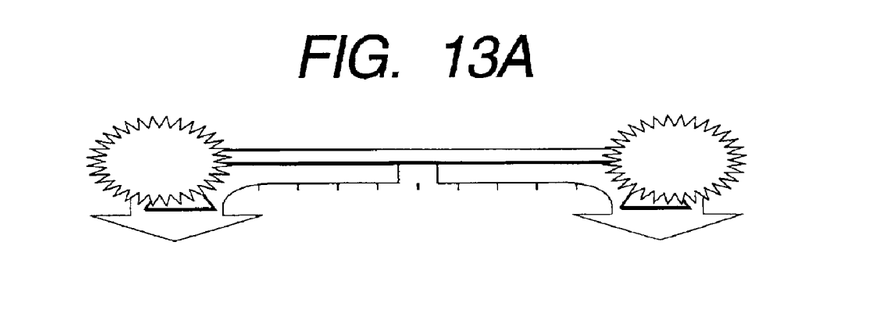
FIGS. 13A and 13B are schematic views for explaining flow of electric charge applied on the photomask blank.

Namely, assuming that the support block 12 is made of the resin that is low in conductivity, when the photomask blank 20 is separated from the absorption board 19, as shown in FIG. 13A, the charge applied onto the photomask blank 20 flows to each support block at a breath. Therefore, in the contacting portion between the photomask blank 20 and each of the support blocks, the electrostatic breakdown occurs. In such a case, the chrome film of the photomask blank 20 melts thereby to form pinholes.

Figure 13B:
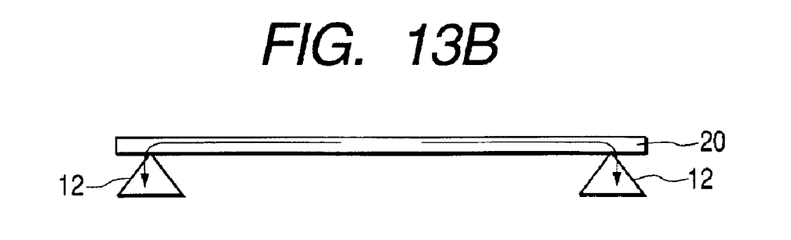

On the other hand, in case that the support block 12 is made of the resin that is high in conductivity, as shown in FIG. 13B, the electric charge applied on the photomask blank 20 flows to the support blocks 12, 12 leniently. Therefore, the electrostatic breakdown is prevented, and yield can be improved.

As described above, according to the coating apparatus 10, since the absorption board 19 is fixed to the beam 15 in the state where the absorption surface 19a looks down, the absorption is always kept horizontal without having unsteadiness. Accordingly, since it is surely possible to prevent the photomask blank 20 from moving slightly at the coating time, quality of a thin film can be improved, so that the yield can be improved.

Further, since it can be realized that the resist film is dried uniformly in the state where the surface to be coated looks down, such convenience can be provided that after end of coating, the operation can immediately proceed to the step of drying the resist film without transporting the photomask blank 20.

(Second Embodiment)

The constitution of a coating apparatus according to a second embodiment is similar to that of the coating apparatus 10 according to the first embodiment. Therefore, overlapped portions are denoted by the same reference numerals.

Figure 14:
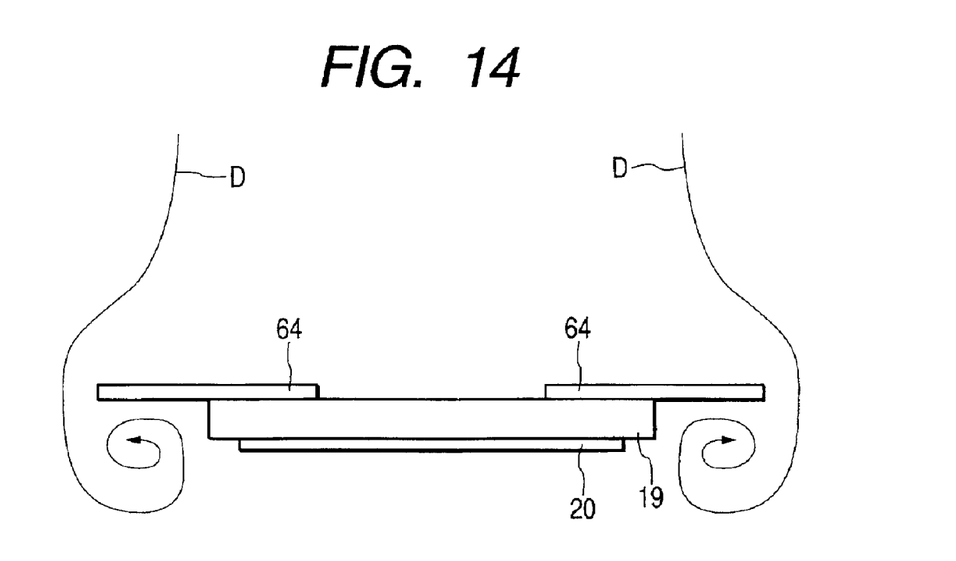
FIG. 14 is a schematic view for explaining a second embodiment.

The coating apparatus according to the second embodiment is provided with, in place of the air current generating apparatus 21, a mask 64 that shuts out down flow in the peripheral portion of an absorption board 19. This mask 64, viewed from a plane surface, is attached to the absorption board 19 so as to protrude from the surroundings of the absorption board 19. Specifically, as shown in FIG. 14, the mask 64 is arranged in parallel to the absorption plate 19 in the peripheral portion on the upper surface of the absorption board 19.

This mask 64 constitutes inhibiting means.

According to the coating apparatus in the second embodiment, the down flow that is to pass through the peripheral portion of the absorption board 19 is shut out by the mask 64. Therefore, air eddy does not occur under a photomask blank 20. Namely, as shown in FIG. 14, the down flow shut out by the mask 64 turns to the rear surface side, and the air eddy is formed only at that portion. Therefore, it is prevented that the resist film is subjected to the air eddy. Hereby, the resist film can be naturally dried uniformly.

Further, a portion to which the mask 64 is to be attached is not limited. For example, it may be attached on a side surface of the absorption board 19. Further, the size of the absorption board 19 may be made larger much than that of the photomask blank 20 and an area where absorption ports are not provided may be secured at he peripheral portion of the absorption surface 19a, whereby the similar effect to the above effect can be obtained.

Further, both the air current generating apparatus 21 and the mask 64 may be provided for the coating apparatus. In this case, unevenness of the resist film caused at the drying time can be prevented more surely.

(Third Embodiment)

The constitution of a coating apparatus according to a third embodiment is similar to that of the coating apparatus 10 according to the first embodiment. Therefore, overlapped portions are denoted by the same reference numerals.

The coating apparatus according to the third embodiment is characterized by mounting thereon, in place of the air current generating apparatus 21, a hot plate.

This hot plate is used in order to forcedly dry a part of the resist film, and it constitutes drying means.

This hot plate is provided for a base frame 11, extending in the left and right direction with the approximately same length as the width of the photomask blank 20. Further, this hot plate is provided near the nozzle 47 in the moving direction of the absorption board 19 at the coating time.

Since this hot plate is fixed, at the coating time, it moves under the surface to be coated relatively together with the nozzle 47. Specifically, at the coating time, the hot plate scans under the surface to be coated so as to follow the scan of the nozzle 47.

Figure 15:
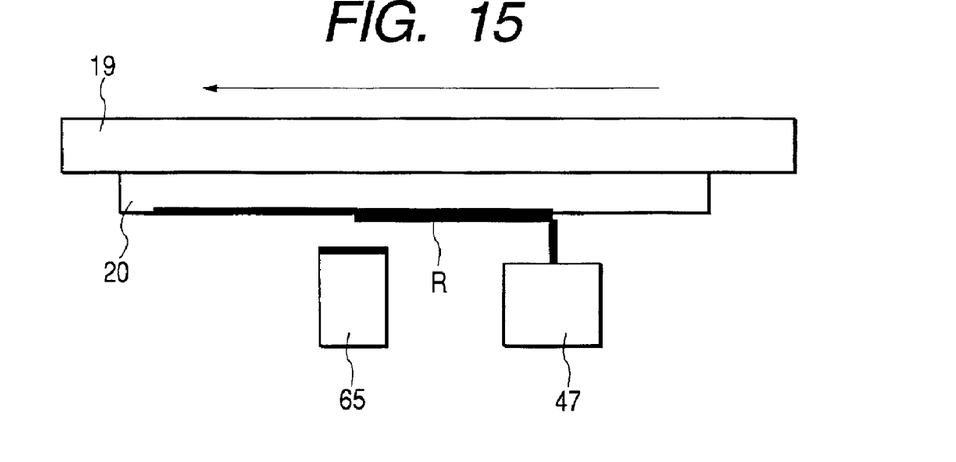
FIG. 15 is a schematic view for explaining a third embodiment.

According to the coating apparatus in the third embodiment, as shown in FIG. 15, when the nozzle 47 scans, since the hot plate 65 scans so as to follow the nozzle 47, the solvent in the coating liquid R flowing out from the nozzle 47 by capillary action is immediately evaporated and removed. Accordingly, when the resist film is dried while the photomask blank 20 is being kept on the absorption board 19, even if the surface to be coated is subjected to the air eddy generated due to the down flow, since the resist film has been already dried, the resist film does not cause the unevenness of dry upon reception of influence of the air eddy.

Further, the coating apparatus may be provided with the hot plate and at least one of the air current generating apparatus 21 and the mask 64. In this case, the unevenness of the resist film caused at the drying time can be prevented more surely.

Though the preferred embodiments of the invention have been described above, the technical idea of the invention is not limited to this. For example, warm wind or hot wind may be supplied from the air current generating apparatus 21. In this case, the resist film can be dried quickly.

According to the invention, in the clean room in which the down flow is constituted, it can be realized that the coated film formed on the surface to be coated of the substrate held in the state where the surface to be coated looks down are dried uniformly.

What is claimed is:

1. A drying method for drying a coating film, wherein said coating film is formed on a substrate surface to be coated, said substrate being held in a posture such that the surface to be coated faces downward in a clean room in which down flow is constituted, the method comprising:

drying the coating film, after forming the coating film, in a state where the posture of the substrate faces downward while inhibiting the down flow from turning into a side of the surface to be coated.

2. The drying method according to claim 1, wherein the coating film is formed by raising a coating liquid by capillarity, where said coating liquid is stored downward of the surface to be coated, and scanning a nozzle over the surface to be coated in a state that said raised coating liquid contacts the surface to be coated through the nozzle.

3. The drying method according to claim 2, wherein a clean gas is supplied toward the coating film from the downside of the surface to be coated on which the coating film has been formed, in order to inhibit the down flow from turning into the side of the surface to be coated.

4. The drying method according to claim 2, wherein the down flow at a peripheral portion of the surface to be coated on which the coating film has been formed is shut out by a mask so as to inhibit the down flow from turning into the side of the surface to be coated.

5. The drying method according to claim 1, wherein, a clean gas is supplied toward the coating film from the downside of the surface to be coated on which the coating film has been formed, in order to inhibit the down flow from turning into the side of the surface to be coated.

6. The drying method according to claim 1, wherein the down flow at a peripheral portion of the surface to be coated on which the coating film has been formed is shut out by a mask so as to inhibit the down flow from turning into the side of the surface to be coated.

7. The drying method according to claim 1, wherein the coating film is a resist film.

8. The drying method according to claim 1, wherein the substrate is a photomask blank obtained by forming a light shielding film on one surface of a transparent substrate.

9. A photomask manufacturing method including:

forming a resist film as a coating film on a light shielding film of a photomask blank by using the drying method according to claim 8.

10. A coating film forming method comprising:

after drying the coating film by the drying method according to claim 1, releasing holding of the substrate; and then bringing the substrate into contact with a conductive member.

11. A drying method for drying a coating film, wherein said coating film is formed by raising a coating liquid by capillarity where said coating liquid is stored downward of the substrate surface to be coated, while said substrate is held in a posture that the surface to be coated faces downward in a clean room in which down flow is constituted, and scanning a nozzle over the surface to be coated in a state that said coating liquid contacts the surface to be coated through the nozzle, said method comprising:

scanning drying means, so as to follow the nozzle when the nozzle is being scanned, for locally drying the coating film.

12. The drying method according to claim 11, wherein the drying means is a hot plate.

13. The drying method according to claim 11, wherein the coating film is a resist film.

14. The drying method according to claim 11, wherein the substrate is a photomask blank obtained by forming a light shielding film on one surface of a transparent substrate.

15. A photomask manufacturing method including:
forming a resist film as a coating film on a light shielding film of a photomask blank by using the drying method according to claim 14.

16. A coating film forming method comprising:
after drying the coating film by the drying method according to claim 11, releasing holding of the substrate; and
then bringing the substrate into contact with a conductive member.

* * * * *